United States Patent
An et al.

(10) Patent No.: US 8,502,184 B2
(45) Date of Patent: Aug. 6, 2013

(54) NONVOLATILE MEMORY DEVICE USING VARIABLE RESISTIVE ELEMENT

(75) Inventors: Hyeong-Geun An, Hwaseong-si (KR);
Sung-Lae Cho, Gwacheon-si (KR);
Ik-Soo Kim, Yongin-si (KR);
Dong-Hyun Im, Hwaseong-si (KR);
Eun-Hee Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/103,013

(22) Filed: May 6, 2011

(65) Prior Publication Data
US 2011/0272663 A1 Nov. 10, 2011

(30) Foreign Application Priority Data
May 6, 2010 (KR) .................. 10-2010-0042415

(51) Int. Cl.
*H01L 29/02* (2006.01)
(52) U.S. Cl.
USPC ..... 257/4; 257/2; 257/3; 257/5; 257/E29.002; 438/102; 438/103; 438/104; 365/165

(58) Field of Classification Search
USPC .... 257/2–5, E29.002; 438/102–104; 365/163
See application file for complete search history.

(56) References Cited

U.S. PATENT DOCUMENTS
2008/0217600 A1 9/2008 Gidon
2009/0161406 A1* 6/2009 Chuang et al. ................ 365/148
2010/0219392 A1* 9/2010 Awaya et al. .................... 257/3

FOREIGN PATENT DOCUMENTS
JP   2008-160004     7/2008
KR   1020080069313 A  7/2008

* cited by examiner

*Primary Examiner* — Jami M Valentine
(74) *Attorney, Agent, or Firm* — Myers Bigel Sibley & Sajovec, P.A.

(57) ABSTRACT

A nonvolatile memory device and a method of fabricating the same are provided. The nonvolatile memory device includes a conductive pillar that extends from a substrate in a first direction, a variable resistor that surrounds the conductive pillar, a switching material layer that surrounds the variable resistor, a first conductive layer that extends in a second direction, and a first electrode that extends in a third direction and contacts the first conductive layer and the switching material layer. Not one of the first, second, and third directions is parallel to another one of the first, second, and third directions.

10 Claims, 25 Drawing Sheets

NONVOLATILE MEMORY DEVICE USING VARIABLE RESISTIVE ELEMENT

CROSS-REFERENCE TO RELATED APPLICATION

This application claims priority to Korean Patent Application No. 10-2010-0042415 filed on May 6, 2010 in the Korean Intellectual Property Office, and all the benefits accruing therefrom under 35 U.S.C. 119, the contents of which in its entirety are herein incorporated by reference.

BACKGROUND

1. Field of the Inventive Concept

The present inventive concept relates to nonvolatile memory devices, and, more particularly, to nonvolatile memory devices that use a variable resistive element and fabricating methods thereof.

2. Description of the Related Art

In general, examples of nonvolatile memory devices that use a resistance material include a resistive Random Access Memory (RRAM), a phase change RAM (PRAM), a magnetic RAM (MRAM), and the like. While a dynamic RAM (DRAM) or a flash memory stores data using an electric charge, a nonvolatile memory device that uses a resistance material stores data using a change in resistance of a variable resistive material (RRAM), a change in state of a phase change material (PRAM), such as a chalcogenide alloy, and a change in resistance of a magnetic tunnel junction (MTJ) thin film due to a magnetization state of a ferromagnetic substance (MRAM).

In a phase-change memory cell, for example, when a phase change material is heated and then cooled, its state rapidly changes into a crystalline state or an amorphous state. The phase change material in the crystalline state has low resistance and phase change material in the amorphous state has high resistance. Thus, the crystalline state is referred to as a set state and stores a data value "0" defined as set data or data "0" while the amorphous state is referred to as a reset state and stores a data value "1" defined as reset data or data "1."

SUMMARY

Embodiments of the present inventive concept provide to a nonvolatile memory device having an improved integration degree.

Embodiments of the present inventive concept also provide a fabricating method of the nonvolatile memory device.

According to an aspect of the present Inventive concept, there is provided a nonvolatile memory device including a conductive pillar that extends from a substrate in a first direction, a variable resistor that surrounds the conductive pillar, a switching material layer that surrounds the variable resistor, a first conductive layer that extends in a second direction, and a first electrode that extends in a third direction and contacts the first conductive layer and the switching material layer. Not one of the first, second, and third directions is parallel to another one of the first, second, and third directions.

According to another aspect of the present Inventive concept, there is provided a nonvolatile memory device including first and second memory pillars that extend from a substrate in a first direction and varying in their resistance values according to first and second data stored therein, respectively, a first conductive layer, a second conductive layer and a third conductive layer that extend in a second direction, wherein a first memory structure is disposed between the first and second conductive layers, a second memory structure is disposed between the first and third conductive layers, and the second and third conductive layer are electrically connected to each other, and a first electrode that extends in a third direction and contacts the first conductive layer and the first and second memory pillars. Not one of the first, second, and third directions is parallel to another one of the first, second, and third directions.

According to still another aspect of the present Inventive concept, there is provided a nonvolatile memory device including first and second gates formed on a substrate to extend in a first direction, a first interlayer insulating layer formed to cover the first and second gates, first and second conductive layers formed on the first interlayer insulating layer to extend in the first direction, a second interlayer insulating layer formed to fill an area between the first and second conductive layers and to expose top surfaces of the first and second conductive layers covering the first and second gates, an electrode formed on the second interlayer insulating layer to extend in a second direction, which is different from the first direction, a hole formed to extend through the first and second interlayer insulating layers and to expose an area between the first and second gates, a switching material layer formed along the sidewall of the hole and contacting the electrode, a variable resistor formed along the sidewall of the switching material layer, and a conductive pillar formed to contact the variable resistor and to fill the hole.

According to a further aspect of the present Inventive concept, there is provided a method of fabricating a nonvolatile memory device, the method including forming first and second gates on a substrate to extend in a first direction, forming a first interlayer insulating layer to cover the first and second gates, forming first and second conductive layers on the first interlayer insulating layer to extend in the first direction, forming a second interlayer insulating layer to fill an area between the first and second conductive layers and to expose top surfaces of the first and second conductive layers covering the first and second gates, forming an electrode on the second interlayer insulating layer to extend in a second direction, which is different from the first direction, forming a hole extending through the first and second interlayer insulating layers and exposing an area between the first and second gates, forming a switching material layer along the sidewall of the hole and contacting the electrode, forming a variable resistor along the sidewall of the switching material layer, and forming a conductive pillar to contact the variable resistor and to fill the hole.

BRIEF DESCRIPTION OF THE DRAWINGS

The above and other features and advantages of the present Inventive concept will become more apparent by describing in detail preferred embodiments thereof with reference to the attached drawings in which.

DETAILED DESCRIPTION OF THE EMBODIMENTS

Figure 1:
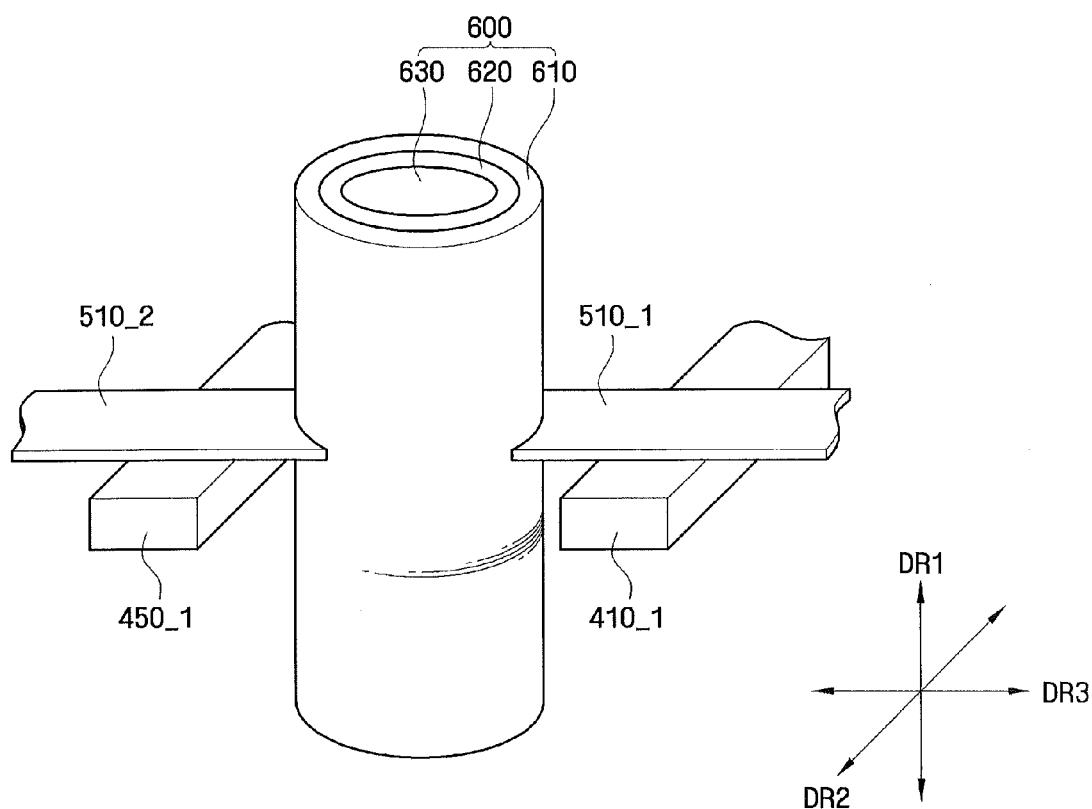
FIG. 1 is a conceptual diagram of a nonvolatile memory device according to an embodiment of the present inventive concept.

Advantages and features of the present Inventive concept and methods of accomplishing the same may be understood more readily by reference to the following detailed description of preferred embodiments and the accompanying drawings. The present Inventive concept may, however, be embodied in many different forms and should not be construed as being limited to the embodiments set forth herein. Rather, these embodiments are provided so that this disclosure will be thorough and complete and will fully convey the concept of the Inventive concept to those skilled in the art, and the present Inventive concept will only be defined by the appended claims. Thus, in some embodiments, well-known methods, procedures, components, and circuitry have not been described in detail to avoid unnecessarily obscuring aspects of the present Inventive concept. In the drawings, the size and relative sizes of layers and regions may be exaggerated for clarity.

It will be understood that when an element or layer is referred to as being "on" another element or layer, it can be directly on to the other element or layer or intervening elements or layers may be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments of the present Inventive concept are described herein with reference to cross-section illustrations that are schematic illustrations of idealized embodiments (and intermediate structures) of the present Inventive concept. As such, variations from the shapes of the illustrations as a result, for example, of manufacturing techniques and/or tolerances, are to be expected. Thus, exemplary embodiments of the present Inventive concept should not be construed as limited to the particular shapes of regions illustrated herein but are to include deviations in shapes that result, for example, from manufacturing.

The present inventive concept will now be described more fully with reference to the accompanying drawings, in which embodiments of the present inventive concept are shown.

In the specification, the expression "to extend in a specific direction" is used to mean "to be longest in the specific direction rather than other directions." For example, the expression "to extend in a first direction (for example, in an up-and-down/vertical direction)" is used to mean "to be longest in the first direction (for example, in the vertical direction) rather than a second direction (for example, in the back-and-forth direction) and a third direction (for example, in the left-and-right direction)."

Hereinafter, embodiments of the present inventive concept are described with reference to resistive random access memory (RRAM) devices. However, the inventive concept can be applied to other nonvolatile memory devices that use resistance materials, such as, but not limited to, magnetic random access memory (MRAM) devices using a magnetic tunnel junction (MTJ) and resistive random access memory (RRAM) devices using a resistive material.

Figure 2:
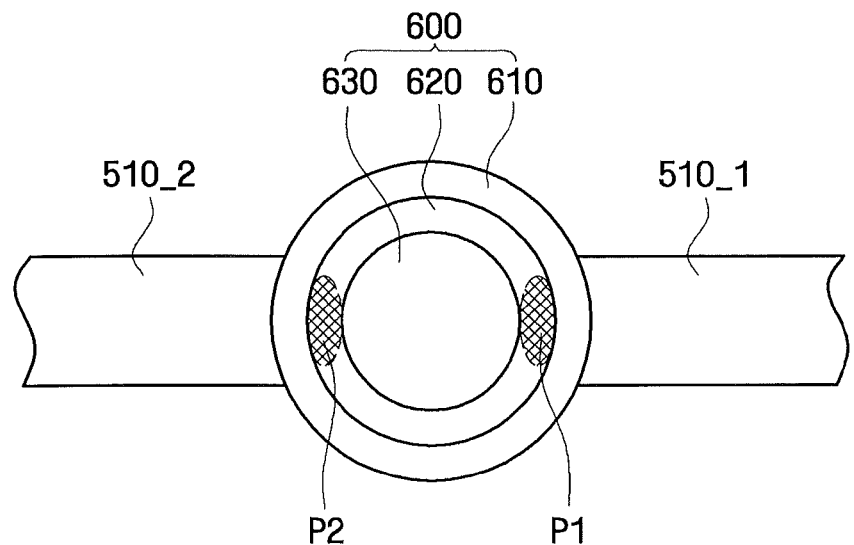
FIG. 2 is a plan view of the nonvolatile memory device shown in FIG. 1.
Figure 3:
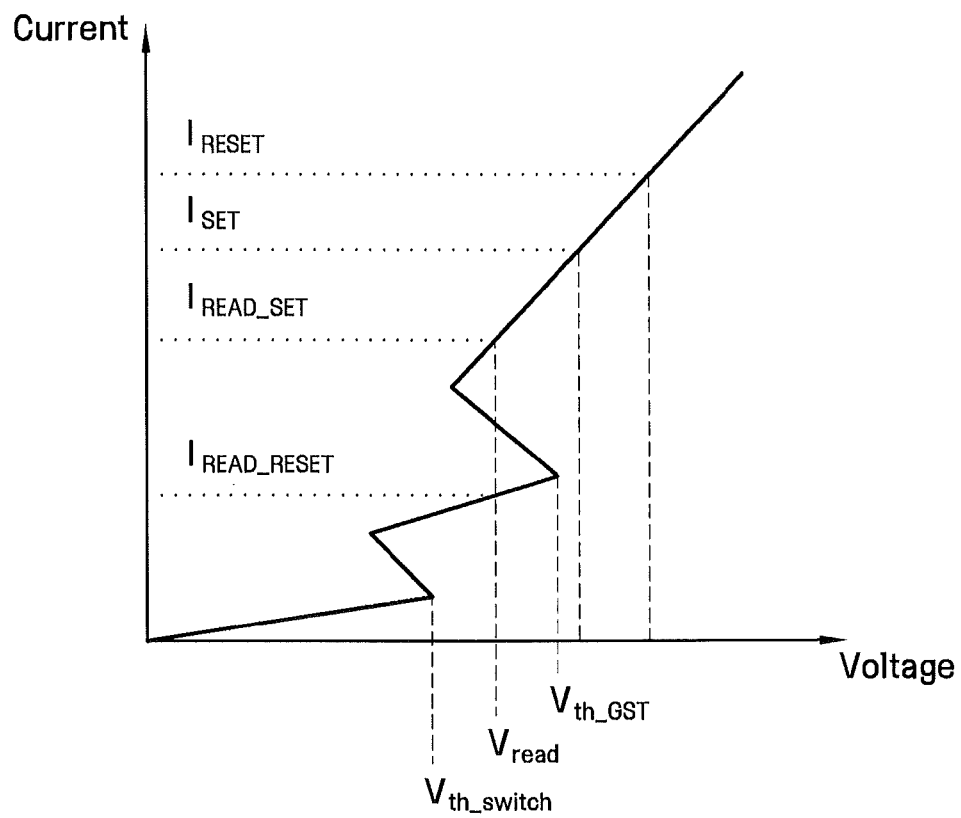
FIG. 3 is a conceptual view illustrating an operation of a switching material layer shown in FIG. 1.

FIG. 1 is a conceptual diagram of a nonvolatile memory device according to an embodiment of the present inventive concept, FIG. 2 is a plan view of the nonvolatile memory device shown in FIG. 1, and FIG. 3 is a conceptual view illustrating operations of a switching material layer shown in FIG. 1.

Referring to FIGS. 1 and 2, the nonvolatile memory device according to the embodiment of the present inventive concept includes a memory pillar 600, a first conductive layer 410_1, a second conductive layer 450_1, a first electrode 510_1, and a second electrode 510_2.

The memory pillar 600 is formed to extend from a substrate in a first direction DR1. The memory pillar 600 includes a resistive element having resistance values varying according to data stored.

In detail, the memory pillar 600 may include a conductive pillar 630 extending from a substrate in a first direction DR1, a variable resistor 620 extending in the first direction DR1 and surrounding the conductive pillar 630, and a switching material layer 610 extending in the first direction DR1 and surrounding the variable resistor 620. For example, the variable resistor 620 may be shaped as a cylinder or a prism entirely covering the circumferential surface of the conductive pillar 630. The switching material layer 610 may also be shaped as a cylinder or a prism entirely covering the circumferential surface of the variable resistor 620.

The conductive pillar 630 may be made of, for example, tungsten (W), titanium nitride (TiN), aluminum (Al), copper (Cu), iridium (Ir), platinum (Pt), ruthenium (Ru), silver (Ag), polycrystalline silicon, and/or other noble metals. The conductive pillar 630 may be made of copper (Cu), iridium (Ir), platinum (Pt), ruthenium (Ru), silver (Ag), polycrystalline silicon, and/or other noble metals.

The variable resistor 620 varies in its resistance according to the electrical signal applied thereto and data is stored according to the resistance. The variable resistor 620 may include, for example, chalcogenide, a transition metal oxide, a perovskite oxide, and/or solid electrolyte substance containing metal ion.

The switching material layer 610 selectively transfers an electrical signal to the variable resistor 620. To perform this operation, the switching material layer 610 may have several properties, which will now be described with reference to FIG. 3. Referring to FIG. 3, a threshold voltage Vth_switch of the switching material layer 610 may be lower than a threshold voltage Vth_GST of the variable resistor 620. In addition, a read voltage Vread is greater than the threshold voltage Vth_switch of the switching material layer 610 and is equal to or less than the threshold voltage Vth_GST of the variable resistor 620. The switching material layer 610 having such properties may include, for example, at least one of AlAsTe, SiTeAsGe, AlGeAsTe and SiSbTe.

Referring back to FIGS. 1 and 2, the first conductive layer 410_1 and the second conductive layer 450_1 are formed to extend from a substrate in a second direction DR2 crossing the first direction DR1. The second direction DR2 is substantially perpendicular to the first direction DR1. The first conductive layer 410_1 and the second conductive layer 450_1 may be parts of a metal wire, for example.

The first electrode 510_1 and the second electrode 510_2 extend in a third direction DR3, which is different from the second direction DR2. For example, the third direction DR3 may be substantially perpendicular to the first direction DR1 and the second direction DR2.

The first electrode 510_1 and the second electrode 510_2 may be formed on the first conductive layer 410_1 and the second conductive layer 450_1 so as to contact the first conductive layer 410_1 and the second conductive layer 450_1, respectively. In addition, the first electrode 510_1 and the second electrode 510_2 may be formed to contact the switching material layer 610 of the memory pillar 600.

The first electrode 510_1 may transfer electrical signals supplied through the first conductive layer 410_1, such as a program current used to program data, or a read current used to read data, to the switching material layer 610. In detail, when electrical signals are applied to the conductive pillar 630 and the first electrode 510_1, a first program region P1 between the conductive pillar 630 and the first electrode 510_1 may vary in its resistance state. That is to say, data may be stored in the first program region P1. In addition, when electrical signals are applied to the conductive pillar 630 and the second electrode 510_2, a second program region P2 between the conductive pillar 630 and the second electrode 510_2 may vary in its resistance state. That is to say, data may be stored in the second program region P2. To sum up, the variable resistor 620 may include two or more program regions P1 and P2, and the program regions may be separately programmed or read.

As shown, a thickness of the first electrode 510_1 may be less than that of the first conductive layer 410_1, and a thickness of the second electrode 510_2 may be less than that of the second conductive layer 450_1. When the first electrode 510_1 and the second electrode 510_2 are relatively thin, a contact area between each of the first electrode 510_1 and the second electrode 510_2 and the switching material layer 610 is relatively small. If the contact area is relatively small, a program operation (or a read operation) may be easily performed even if the electrical signal is weak (that is, even if an amount of current is small).

Figure 4:
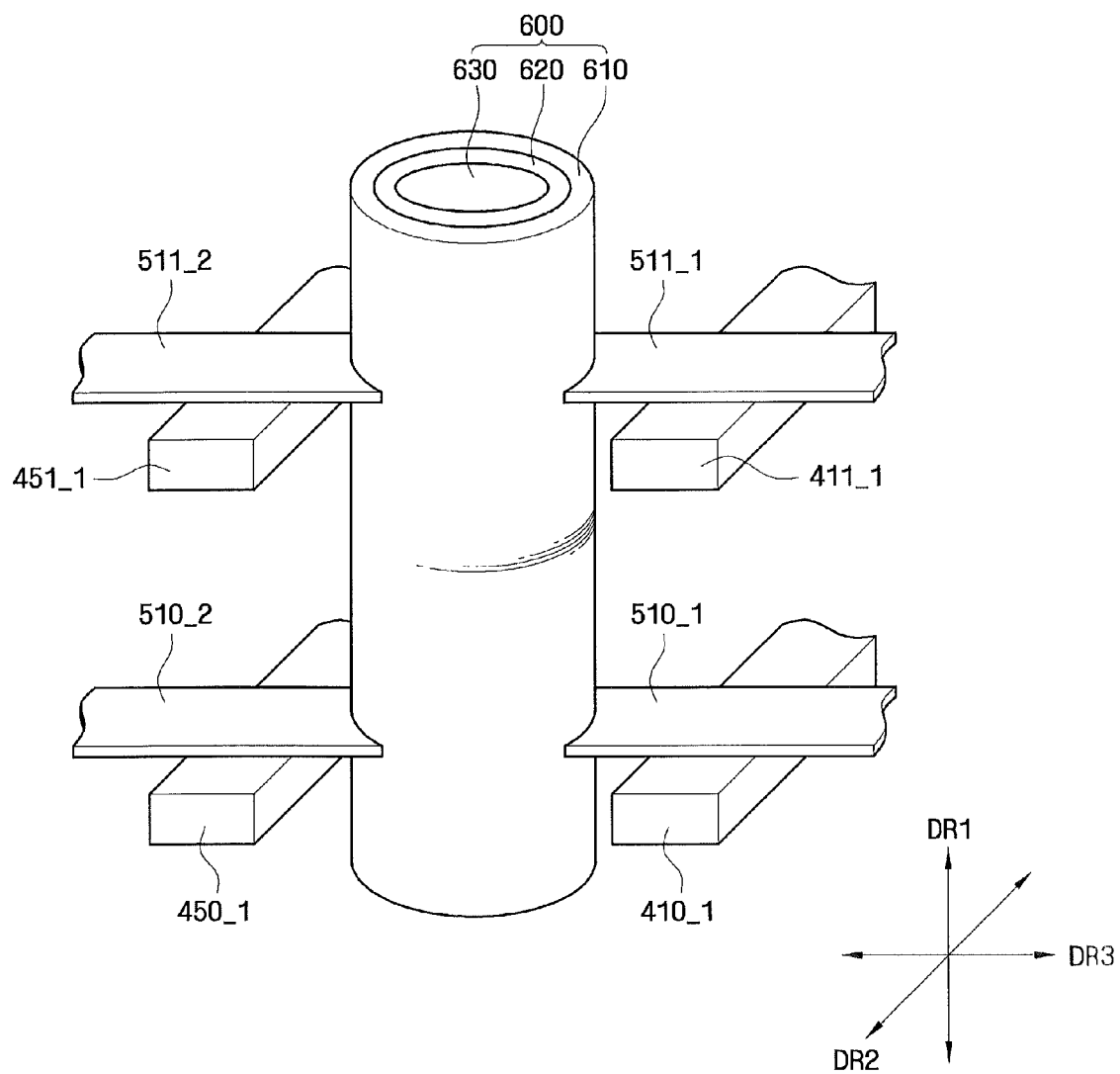
FIG. 4 is a conceptual diagram of a nonvolatile memory device according to another embodiment of the present inventive concept.

FIG. 4 is a conceptual diagram of a nonvolatile memory device according to another embodiment of the present inventive concept.

Referring to FIG. 4, the nonvolatile memory device according to the embodiment of the present inventive concept may include a plurality of electrodes 510_1, 510_2, 511_1, and 511_2 stacked in a first direction DR1 (for example, in an up-down/vertical direction) in a memory pillar 600. FIG. 4 illustrates two-layered electrodes 510_1, 510_2, 511_1, and 511_2, but aspects of the present inventive concept are not limited thereto. The plurality of electrodes 510_1, 510_2, 511_1, and 511_2 are formed to contact a plurality of conductive layers 410_1, 450_1, 411_1, and 451_1, respectively.

As described above, the program region of a variable resistor 620 between the conductive pillar 630 and each of the electrodes 510_1, 510_2, 511_1, and 511_2 may vary in its resistance state according to electrical signals applied to the conductive pillar 630 and the respective electrodes 510_1, 510_2, 511_1, and 511_2. In FIG. 4, four program regions are illustrated.

That is to say, in the illustrated embodiment, because a memory pillar 630 extends in the first direction DR1 (for example, in the up-down/vertical direction), a plurality of program regions in which data is stored can be formed in one memory pillar 630. Accordingly, the integration degree of the nonvolatile memory device can be increased.

Figure 5:
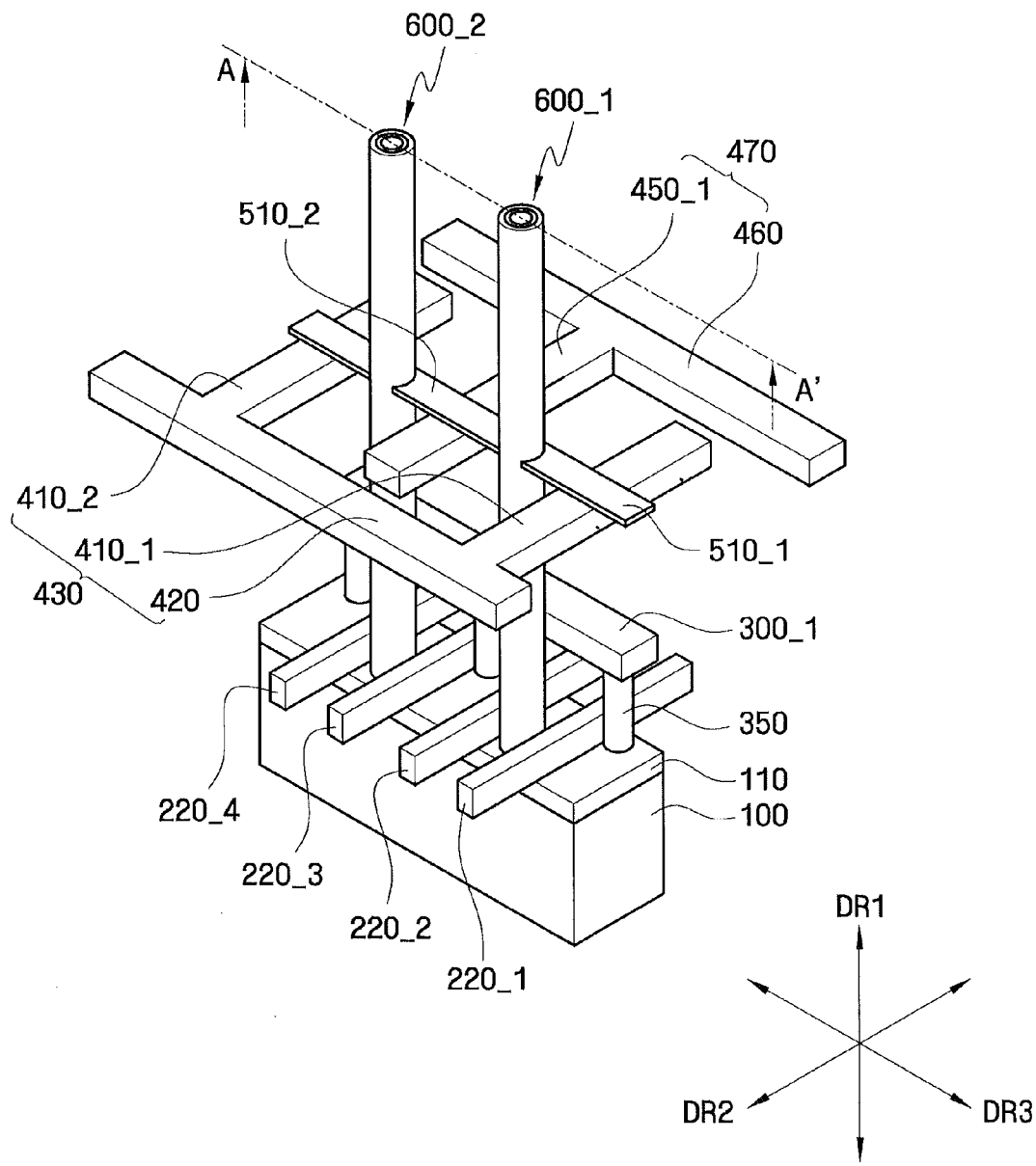
FIG. 5 is a perspective view of a nonvolatile memory device according to still another embodiment of the present inventive concept.
Figure 6:
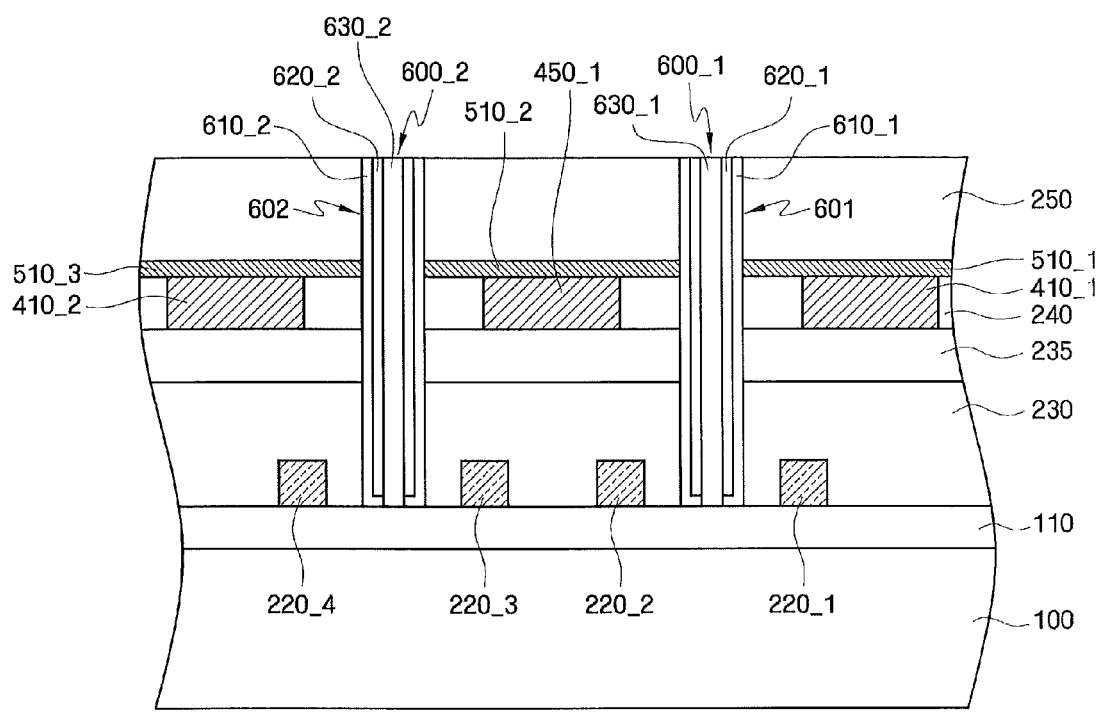
FIG. 6 is a cross-sectional view taken along the line A-A' of FIG. 5.
Figure 7:
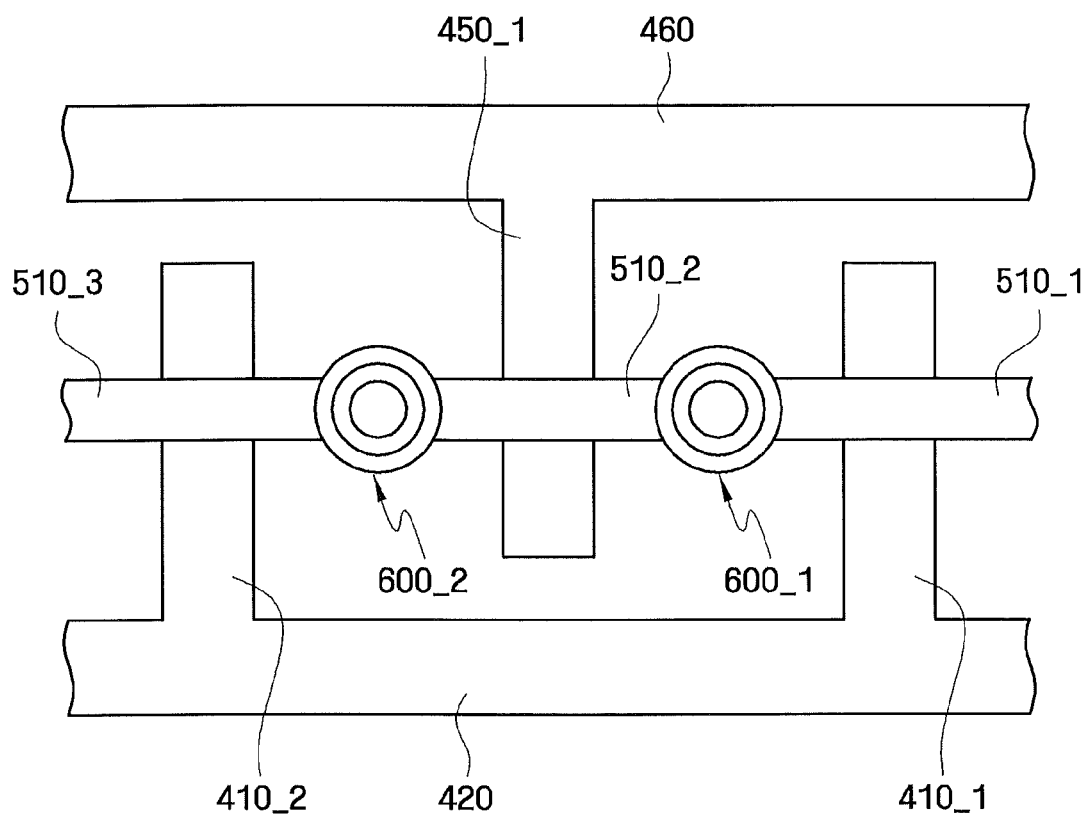
FIG. 7 is a partial plan view of a nonvolatile memory device according to still another embodiment of the present inventive concept.

FIG. 5 is a perspective view of a nonvolatile memory device according to still another embodiment of the present inventive concept, FIG. 6 is a cross-sectional view taken along the line A-A' of FIG. 5, and FIG. 7 is a partial plan view of a nonvolatile memory device according to still another embodiment of the present inventive concept. FIGS. 5 through 7 illustrate practical implementation of the nonvolatile memory device shown in FIG. 1 according to some embodiments of the present inventive concept.

Referring to FIGS. 5 through 7 a substrate 100 includes an active region 110 defined therein. The substrate 100 may be a silicon substrate, a silicon on insulator (SOI) substrate, a GaAs substrate, a SiGe substrate, a ceramic substrate, a quartz substrate, and/or a glass substrate for a display.

First through fourth gates 220_1-220_4 are disposed on the substrate 100 to extend in a second direction DR2. The first through fourth gates 220_1-220_4 may be formed by depositing polysilicon, tungsten (W), and/or a metal such as tantalum (Ta), titanium (Ti), molybdenum (Mo), hafnium (Hf), zirconium (Zr), cobalt (Co), chromium (Cr), nickel (Ni), platinum (Pt), and/or ruthenium (Ru), and patterning the same.

Although not clearly shown, impurities are injected into the active region 110 in both sides of each of the first through fourth gates 220_1-220_4 to form source/drain regions.

A first interlayer insulating layer 230 is formed to cover the first through fourth gates 220_1-220_4. A second interlayer insulating layer 235 may be formed on the first interlayer insulating layer 230.

A first metal wire 430 and a second metal wire 470 are formed on the second interlayer insulating layer 235. The first metal wire 430 includes a first conductive layer 410_1, a third conductive layer 410_2, and a first connection wire 420. The second metal wire 470 includes a second conductive layer 450_1 and a second connection wire 460.

In detail, first through third conductive layers 410_1, 450_1, and 410_2 are formed to extend in a second direction DR2. In addition, the first conductive layer 410_1 and the third conductive layer 410_2 are physically connected to the first connection wire 420 extending in a third direction DR3, so that the first conductive layer 410_1 and the third conductive layer 410_2 are electrically connected to each other. The second conductive layer 450_1 is electrically disconnected from the first conductive layer 410_1 and the third conductive layer 410_2. The second conductive layer 450_1 is physically connected to the second connection wire 460.

The first metal wire 430 and the second metal wire 470 may be disposed in a cross finger type. In other words, the first and second conductive layers 410_1 and 410_2 connected to the first connection wire 420, and the second conductive layer 450_1 connected to the second connection wire 460 are alternately arranged. When viewed in the third direction DR3, the second conductive layer 450_1 of the second metal wire 470 is arranged after the first conductive layer 410_1 of the first metal wire 430, and the third conductive layer 410_2 of the first metal wire 430 is arranged after the second conductive layer 450_1 of the second metal wire 470.

The third interlayer insulating layer 240 is formed to fill regions between the first through third conductive layers 410_1, 450_1, and 410_2, and to expose top surfaces of the first through third conductive layers 410_1, 450_1, and 410_2.

First through third electrodes 510_1, 510_2, and 510_3 are formed on the third interlayer insulating layer 240 to extend in the third direction DR3 different from the second direction DR2. The first electrode 510_1 is formed on the top surface of the first conductive layer 410_1, and contacts the first conductive layer 410_1 and the memory pillar 600_1, specifically the switching material layer 610_1. The second electrode 510_2 is formed on the top surface of the second conductive layer 450_1, and contacts the second conductive layer 450_1 and the memory pillars 600_1 and 600_2, specifically the switching material layers 610_1 and 610_2. The third electrode 510_3 is formed on the top surface of the third conductive layer 410_2, and contacts the third conductive layer 410_2 and the memory pillar 600_2, specifically the switching material layer 610_2.

The fourth interlayer insulating layer 250 is disposed on the third interlayer insulating layer 240 having the first through third electrodes 510_1, 510_2, and 510_3.

Holes 601 and 602 extend in the first direction DR1 to extend through the first through third interlayer insulating layers 230, 235, and 240. In detail, the hole 601 is positioned between the first gate 220_1 and the second gate 220_2, between the first conductive layer 410_1 and the second conductive layer 450_1, and between the first electrode 510_1 and the second electrode 510_2. The hole 602 is positioned between the third gate 220_3 and the fourth gate 220_4, between the second conductive layer 450_1 and the third conductive layer 410_2, and between the second electrode 510_2 and third electrode 510_3.

The switching material layers 610_1 and 610_2, the variable resistors 620_1 and 620_2, and conductive pillars 630_1 and 630_2 are formed in the holes 601 and 602, respectively. The switching material layers 610_1 and 610_2 are formed along sidewalls of the holes 601 and 602, the variable resistors 620_1 and 620_2 are formed along sidewalls of the switching material layers 610_1 and 610_2, and the conductive pillars 630_1 and 630_2 are formed to contact the variable resistors 620_1 and 620_2 and to fill the holes 601 and 602.

The active region 110 may be divided into multiple regions by the first through fourth gates 220_1-220_4, and some of the multiple regions are electrically connected to the conductive pillars 630_1 and 630_2, and the other regions are connected to a bit line 300_1 through a contact 350. For example, the active region 110 may be divided into three regions, that is, first through third regions, by the first and second gates 220_1 and 220_2. The second region may be located between the first and second gates 220_1 and 220_2, and the first and third regions may be located at either side of the gates 220_1-220_4. The second region may be electrically connected to the conductive pillars 630_1 and 630_2, and the first through third regions may be electrically connected to the bit line 300_1 through the contact 350.

Figure 8:
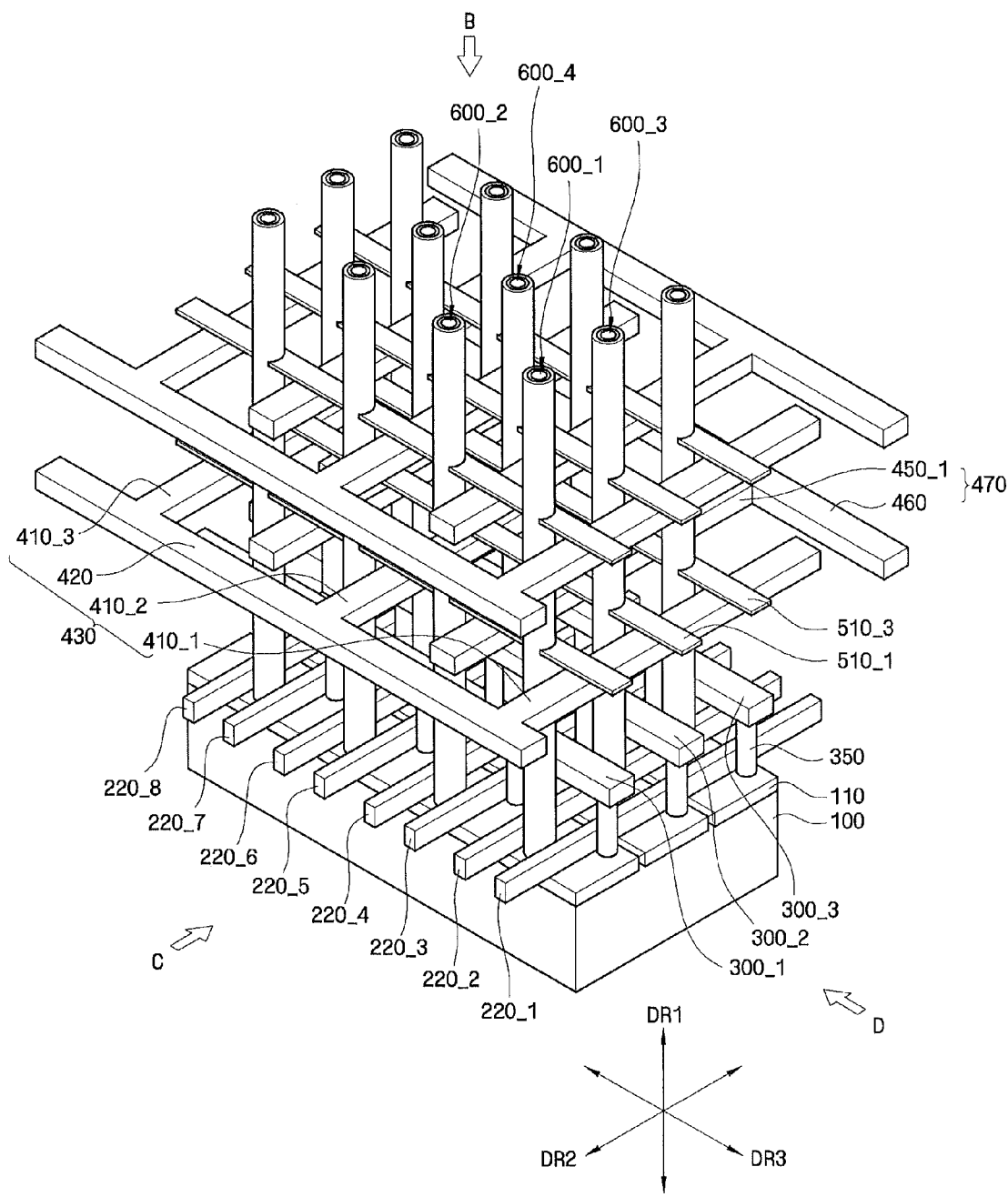
FIG. 8 is a perspective view of a nonvolatile memory device according to still another embodiment of the present inventive concept.
Figure 9:
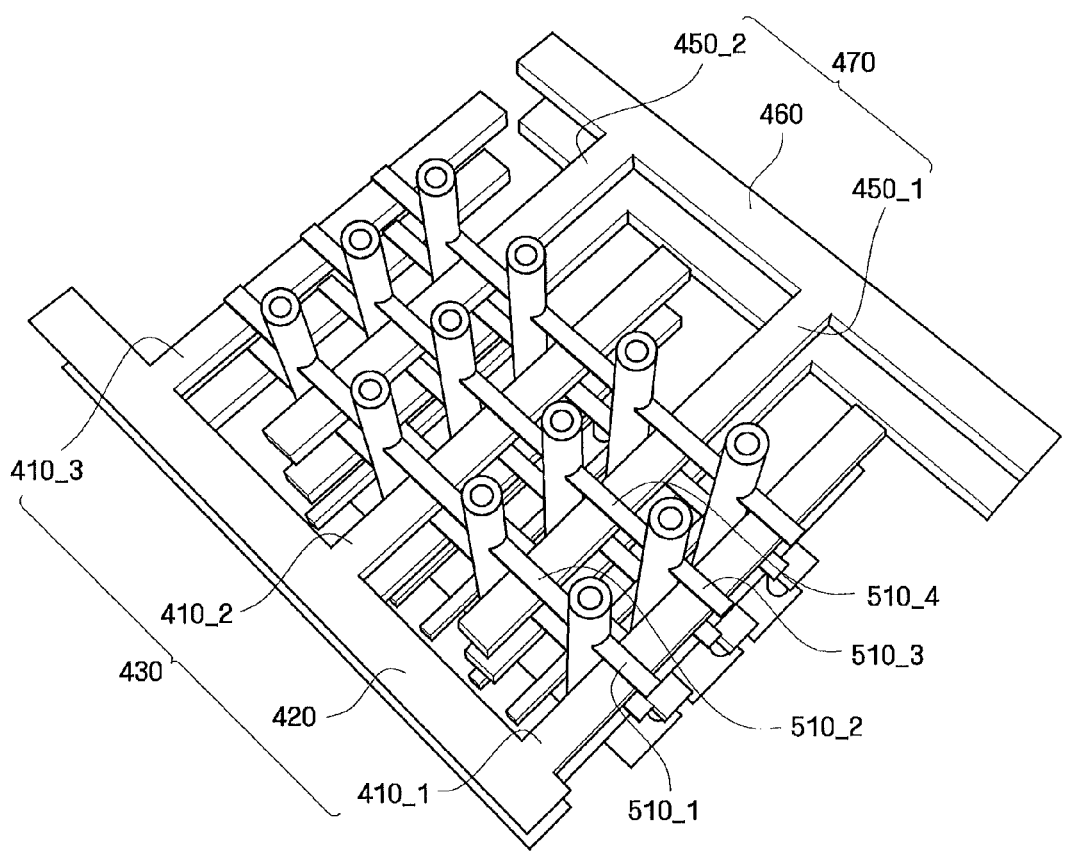
FIG. 9 is a plan view of FIG. 8, viewed in a "B" direction.
Figure 10:
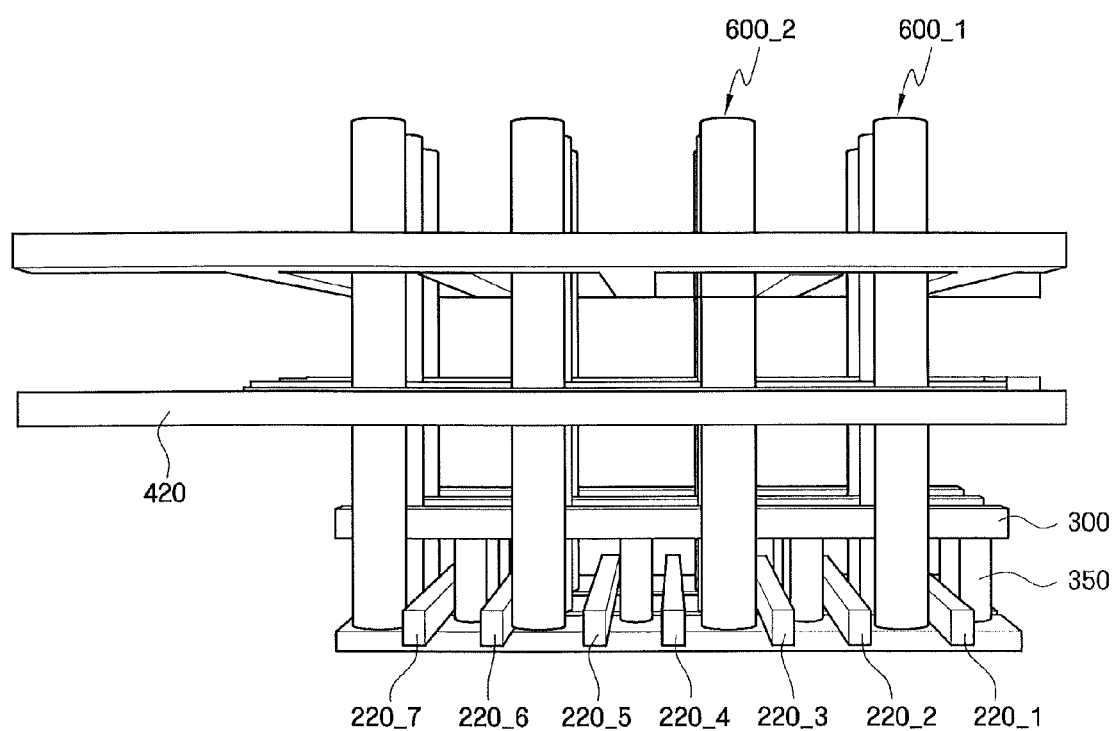
FIG. 10 is an elevation view of FIG. 8, viewed in a "C" direction.
Figure 11:
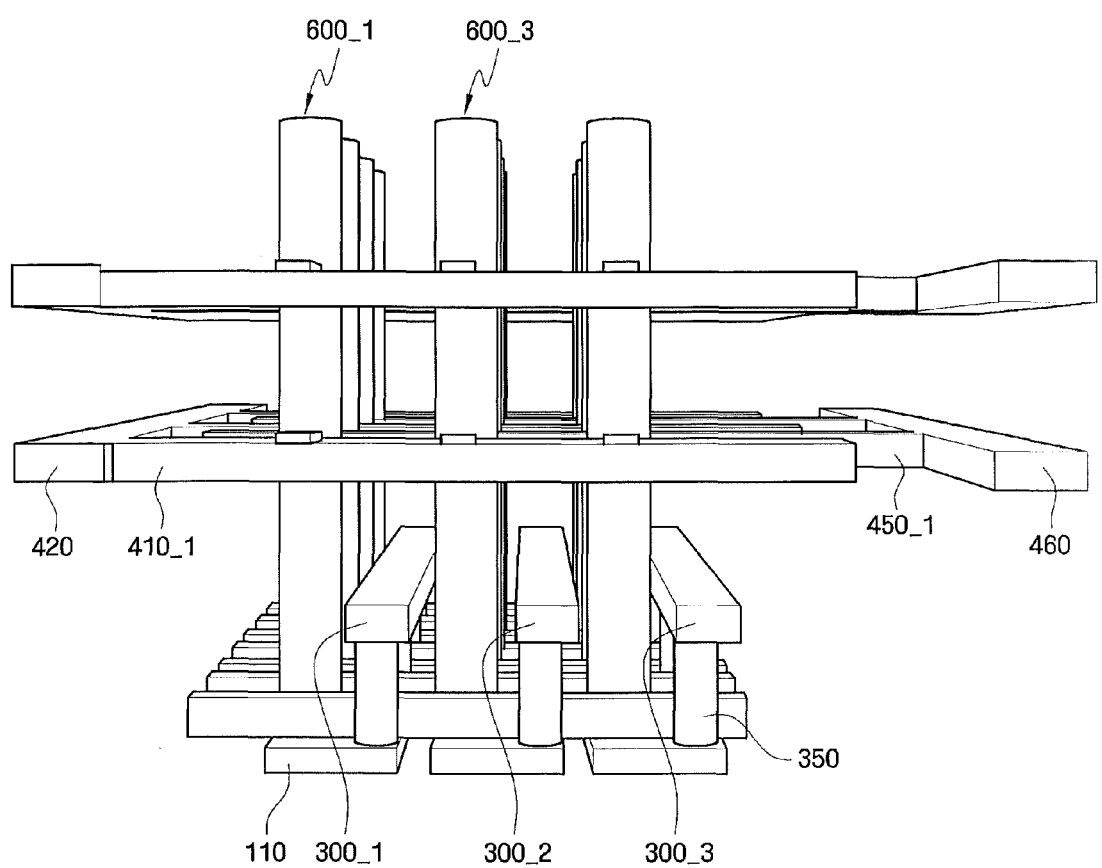
FIG. 11 is an elevation view of FIG. 8, viewed in a "D" direction.

FIG. 8 is a perspective view of a nonvolatile memory device according to still another embodiment of the present inventive concept, FIG. 9 is a plan view of FIG. 8, viewed in a 'B' direction, FIG. 10 is an elevation view of FIG. 8, viewed in a 'C' direction, and FIG. 11 is an elevation view of FIG. 8, viewed in a 'D' direction. FIGS. 8 through 11 illustrate practical implementations of the nonvolatile memory device shown in FIG. 4, according to some embodiments of the inventive concept, and the illustrated nonvolatile memory device is substantially the same as that shown in FIG. 4, except that a plurality of memory pillars are arrayed.

A plurality of memory pillars 600_1-600_4 are formed to extend from a substrate 100 in a first direction DR1. As described above, the memory pillars 600_1-600_4 may include conductive pillars, variable resistors, and/or switching material layers.

Although the first metal wire 430 and the second metal wire 470 have a two-layered structure in the illustrated embodiment, embodiments of the present inventive concept are not limited thereto. Conductive layers 410_1, 410_2, and 410_3 of the first metal wire 430, and conductive layers 450_1 and 450_2 of the second metal wire 470 are formed to extend in a second direction DR2. The conductive layers 410_1, 410_2, and 410_3 are connected to each other through a first connection wire 420 extending in a third direction DR3, and the conductive layers 450_1 and 450_2 are connected to each other through a second connection wire 460 extending in the third direction DR3.

The first and second metal wires 430 and 470 are connected to each other through memory pillars 600_1-600_4 and electrodes 510_1-510_4.

First through seventh gates 220_1-220_7 are formed across an active region 110.

The active region 110 is divided into multiple regions by the first through seventh gates 220_1-220_7. Some of the multiple regions are electrically connected to bit lines 300_1-300_3 through a contact 350, and the other regions are connected to conductive pillars of the memory pillars 600_1-600_4.

FIGS. 12A through 15B illustrate operations of the nonvolatile memory devices shown in FIGS. 8 through 11 according to some embodiments of the inventive concept.

Figure 12A:
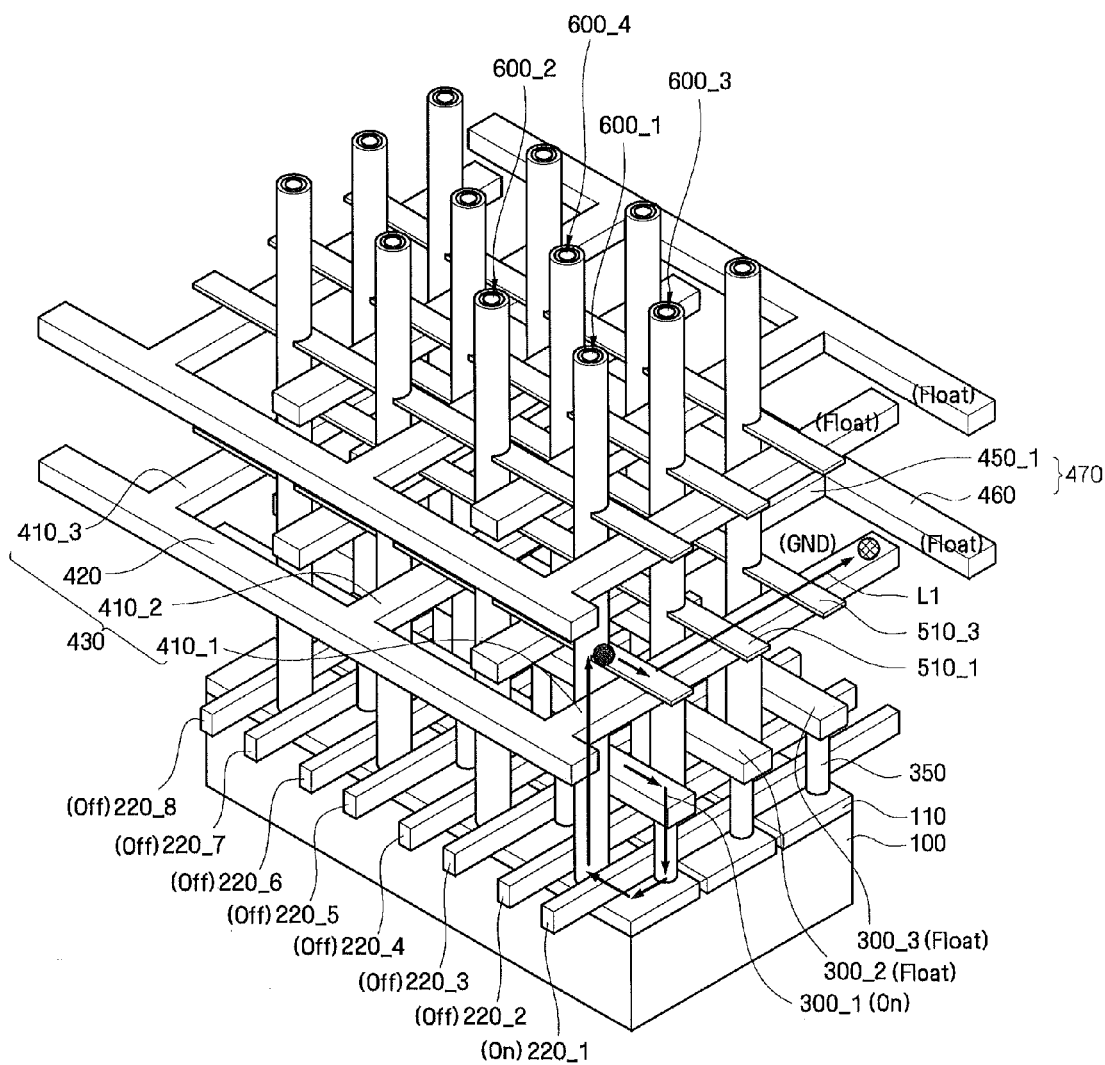
FIGS. 12A through 15B illustrate operations of the nonvolatile memory devices shown in FIGS. 8 through 11 according to embodiments of the present inventive concept.
Figure 12B:
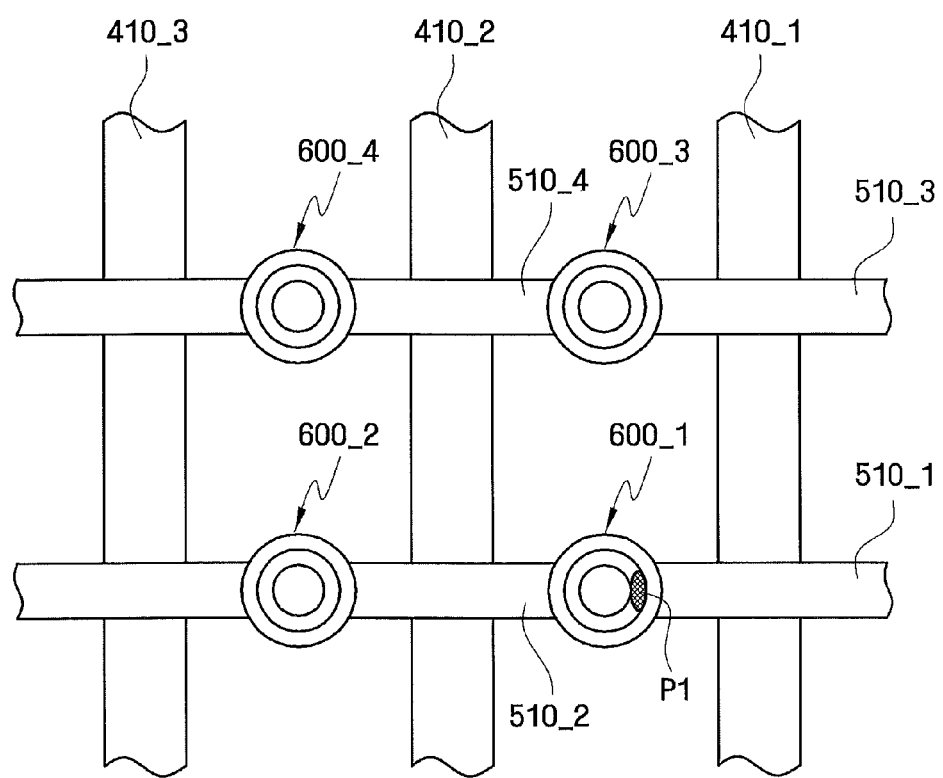

Referring to FIGS. 12A and 12B, conditions for programming a program region P1 of a memory pillar 600_1 will now be described.

A program current is applied through the bit line 300_1 corresponding to the memory pillar 600_1. The other bit lines 300_2 and 300_3 are made to float. The gate 220_1 is turned on and the other gates 200_2-200_7 are turned off. The first metal wire 430 is grounded and the second metal wire 470 is made to float.

Under the programming conditions, a current L1 applied from the bit line 300_1 is output as a ground voltage through the gate 220_1, the conductive pillar of the memory pillar 600_1, the electrode 510_1, and the first metal wire 430.

Figure 13A:
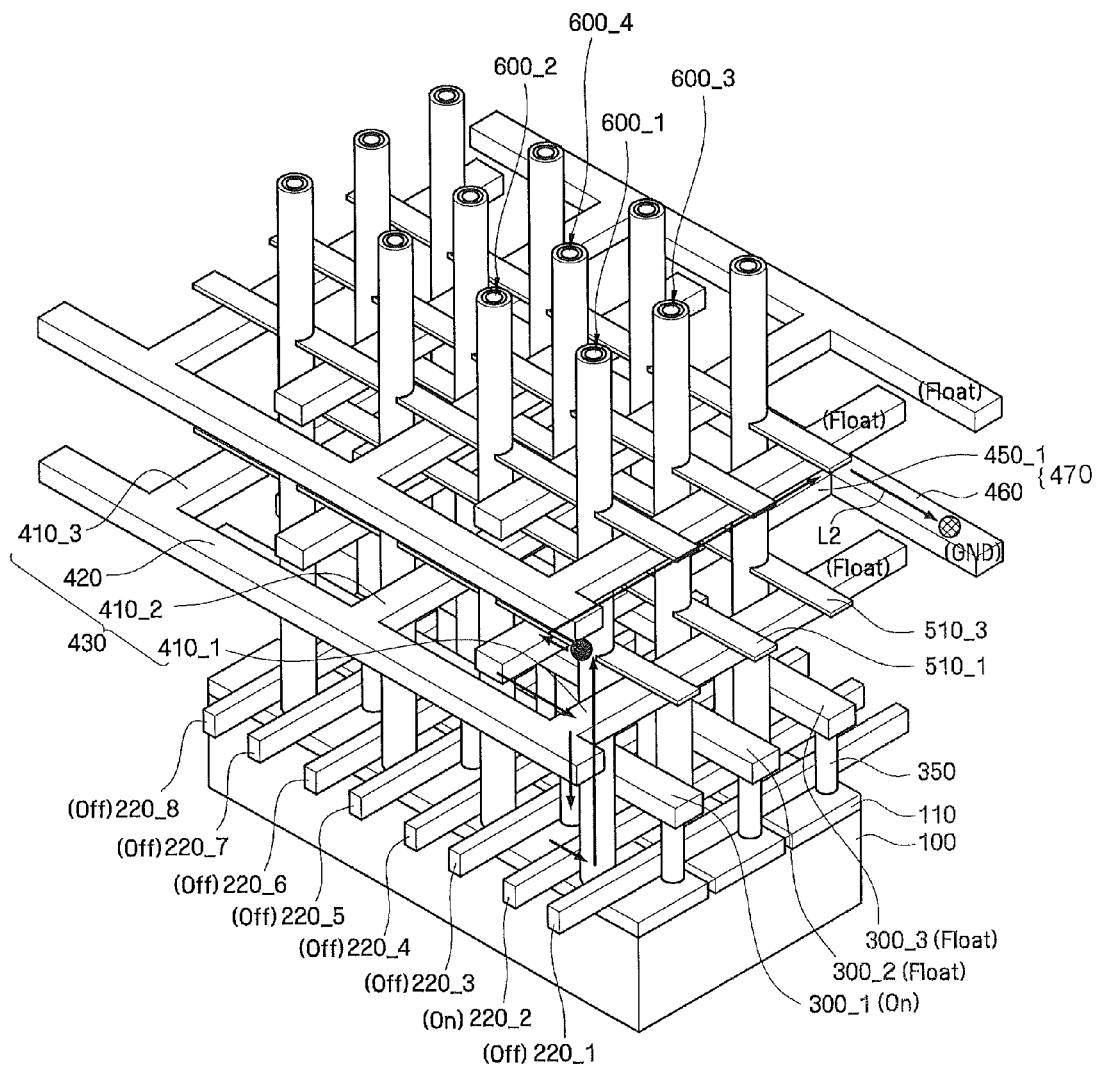
Figure 13B:
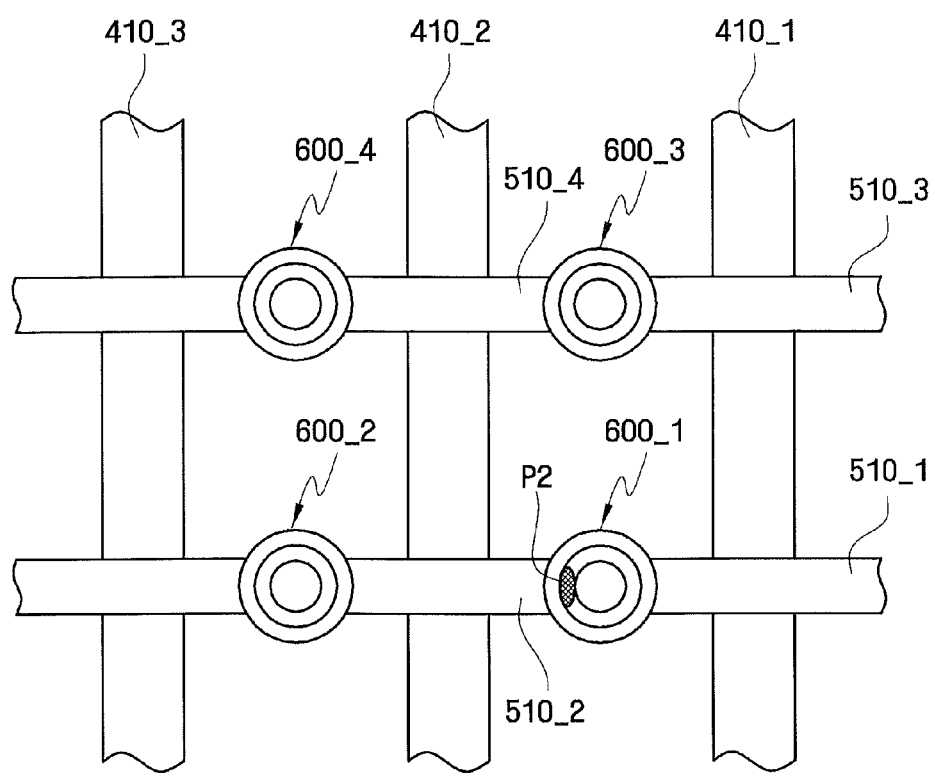

The programming conditions for a program region P2 of the memory pillar 600_1 will now be described with reference to FIGS. 13A and 13B.

A program current is applied through the bit line 300_1 corresponding to the memory pillar 600_1. The other bit lines 300_2 and 300_3 are made to float. The gate 220_2 is turned on and the other gates 200_1 and 200_3-200_7 are turned off. The first metal wire 430 is made to float and the second metal wire 470 is grounded.

Under the programming conditions, a current L2 applied from the bit line 300_1 is output as a ground voltage through the gate 220_2, the conductive pillar of the memory pillar 600_1, the electrode 510_2, and the second metal wire 470.

Figure 14A:
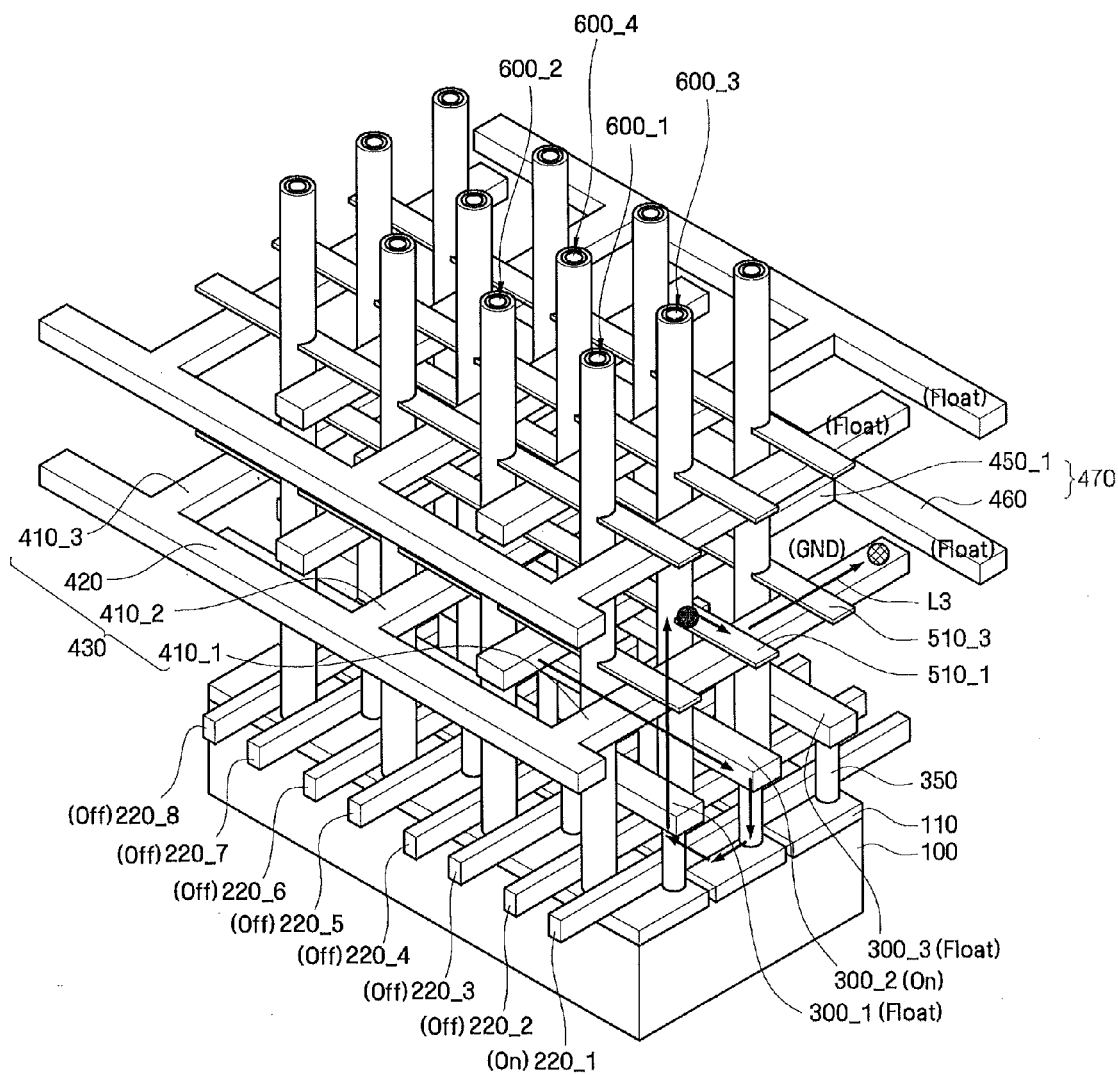
Figure 14B:
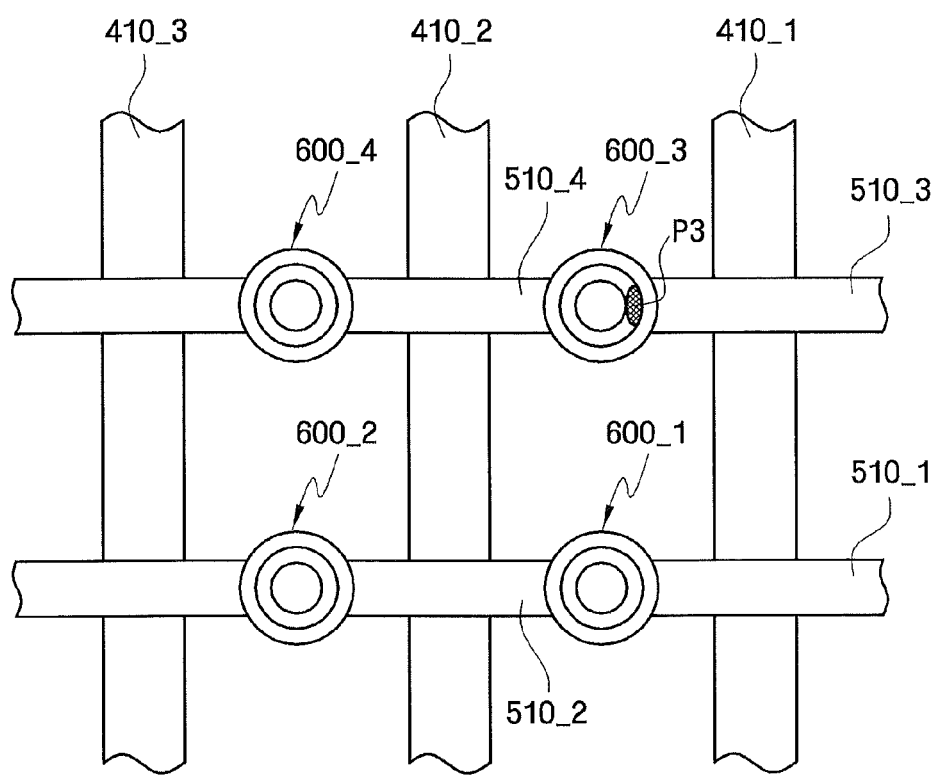

The programming conditions for a program region P3 of the memory pillar 600_3 will now be described with reference to FIGS. 14A and 14B.

A program current is applied through the bit line 300_2 corresponding to the memory pillar 600_3. The other bit lines 300_1 and 300_3 are made to float. The gate 220_1 is turned on and the other gates 200_2-200_7 are turned off. The first metal wire 430 is grounded and the second metal wire 470 is made to float.

Under the programming conditions, a current L3 applied from the bit line 300_2 is output as a ground voltage through the gate 220_1, the conductive pillar of the memory pillar 600_3, the electrode 510_3, and the first metal wire 430.

Figure 15A:
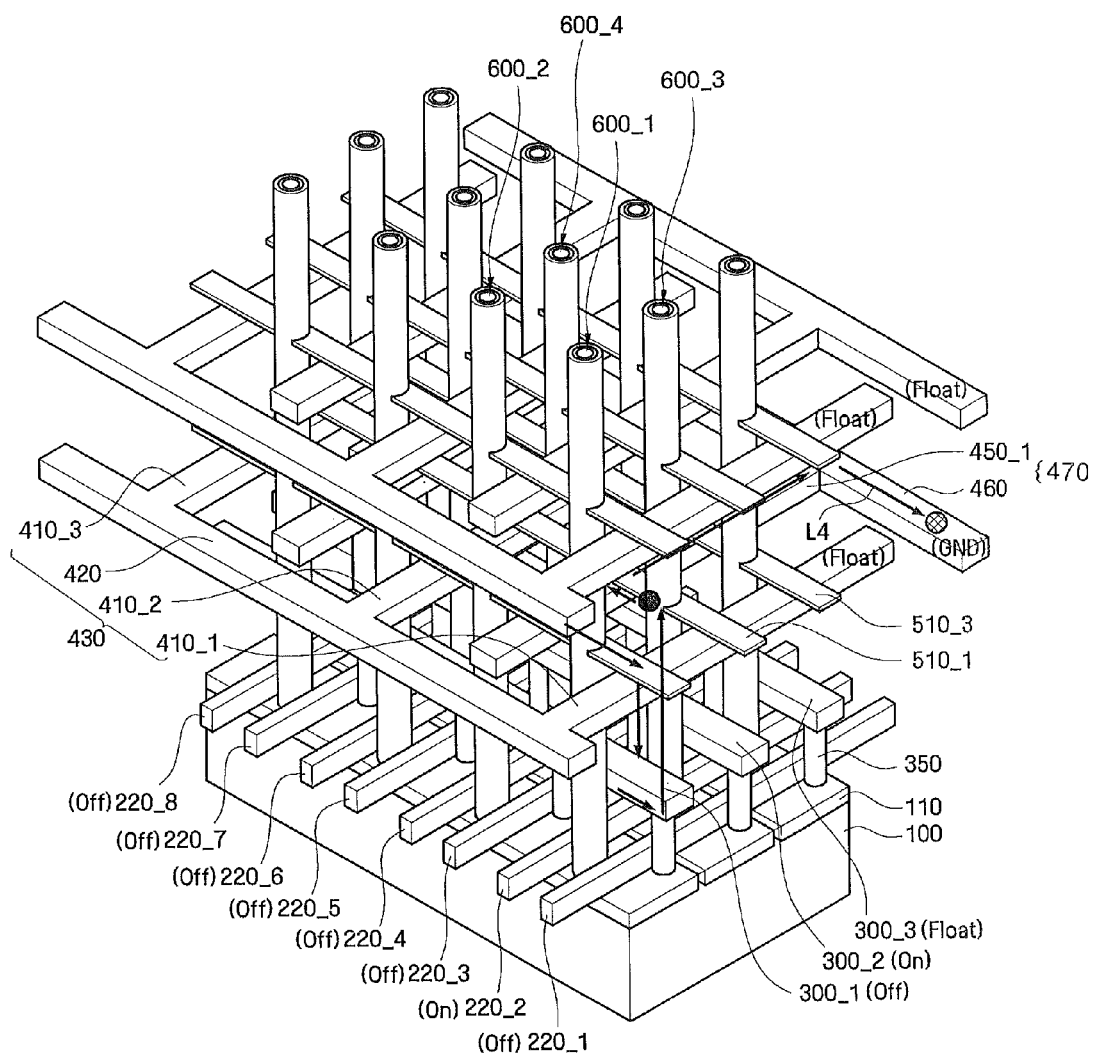
Figure 15B:
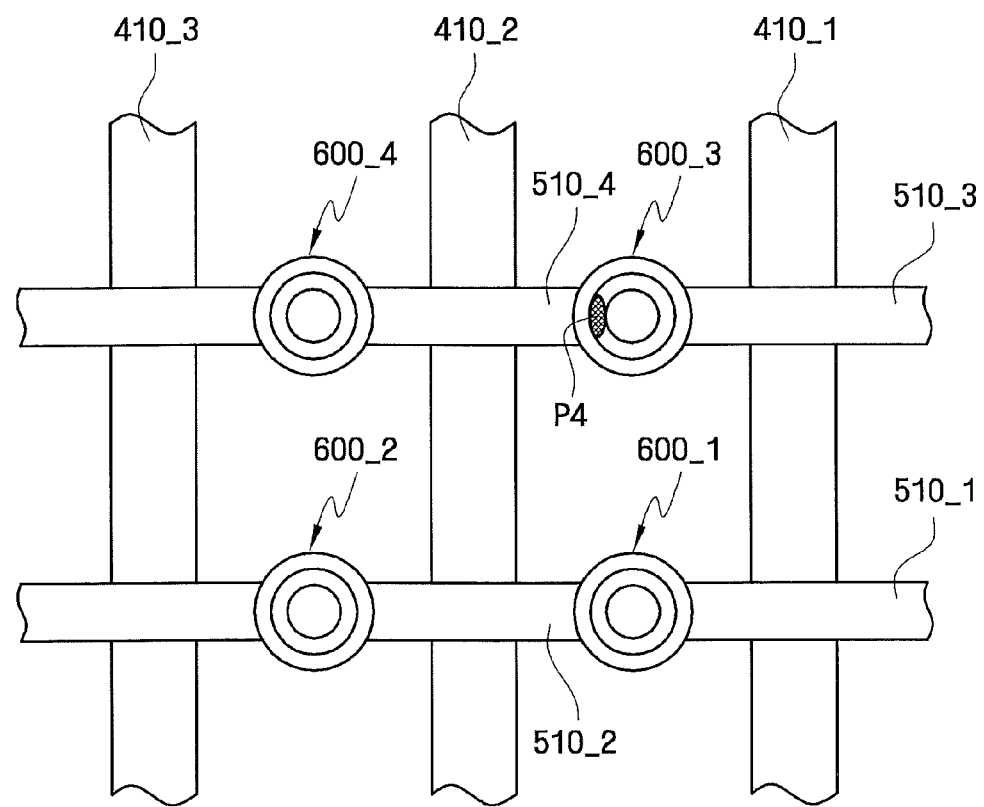

The programming conditions for a program region P4 of the memory pillar 600_3 will now be described with reference to FIGS. 15A and 15B.

A program current is applied through the bit line 300_2 corresponding to the memory pillar 600_4. The other bit lines 300_1 and 300_3 are made to float. The gate 220_2 is turned on and the other gates 200_2-200_7 are turned off. The first metal wire 430 is made to float and the second metal wire 470 is grounded.

Under the programming conditions, a current L4 applied from the bit line 300_2 is output as a ground voltage through the gate 220_2, the conductive pillar of the memory pillar 600_4, the electrode 510_4, and the second metal wire 470.

Figure 16A:
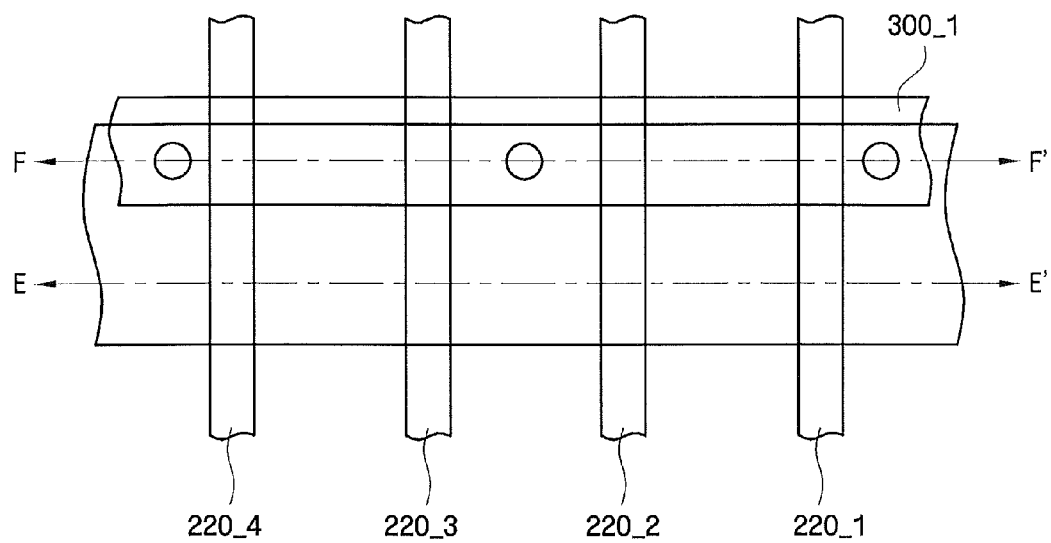
FIGS. 16A through 19B illustrate intermediate fabrication process steps for the nonvolatile memory devices shown in FIGS. 8 through 11 according to some embodiments of the present inventive concept.

Hereinafter, a nonvolatile memory device according to still another embodiment of the present inventive concept will be described with reference to FIG. 19B and FIGS. 5 through 7. FIGS. 16A through 19B illustrate intermediate process steps for describing a fabricating method of the nonvolatile memory devices shown in FIGS. 8 through 11, in which FIGS. 16B and 16C are cross-sectional views taken along lines E-E' and F-F' of FIG. 16A, FIGS. 17A, 18A, 19A and 6 are cross-sectional views taken along line E-E' of FIG. 16A, FIG. 17B illustrates a first metal wire and a second metal wire, FIG. 18B illustrates a conductor for an electrode, and FIG. 19B illustrates holes.

Figure 16B:
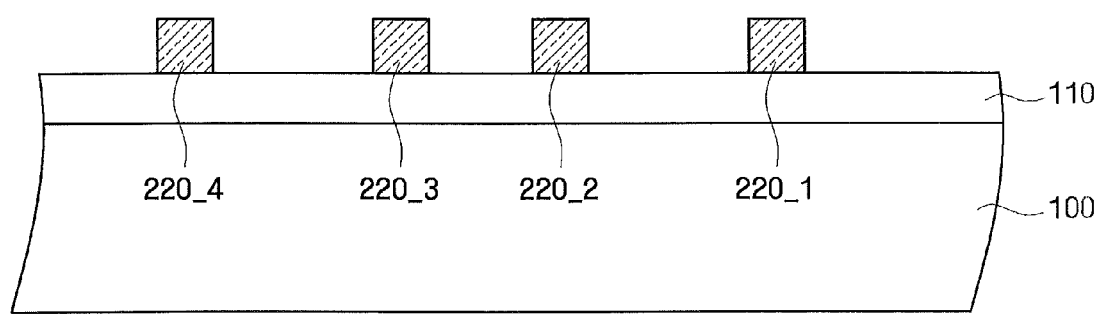
Figure 16C:
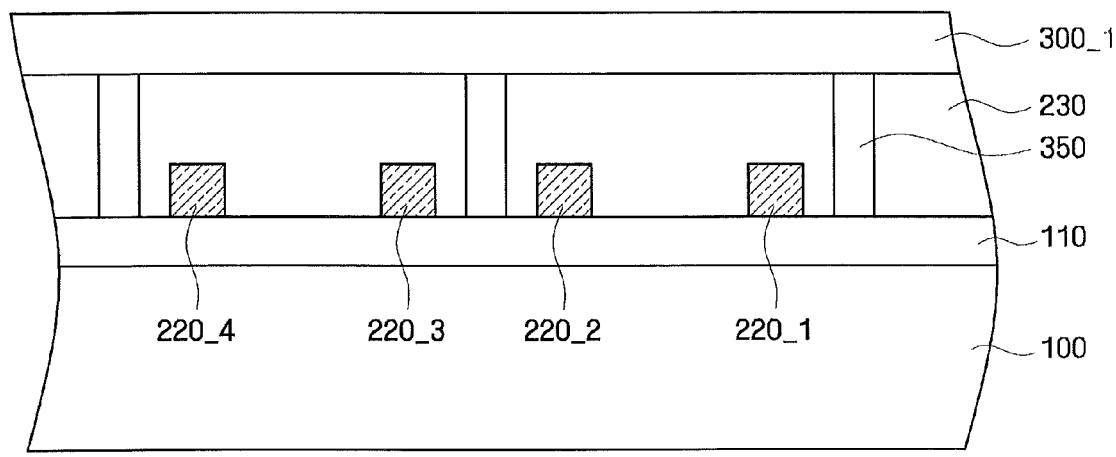

Referring first to FIGS. 16A through 16C, an active region 110 is formed in the substrate 100.

Next, the first through fourth gates 220_1-220_4 are formed on the substrate 100 to extend in the second direction DR2.

The first interlayer insulating layer 230 is formed to cover the first through fourth gates 220_1-220_4.

The contact 350 extending through the first interlayer insulating layer 230 is formed, and the bit line 300_1 is formed on the first interlayer insulating layer 230 having the contact 350.

Figure 17A:
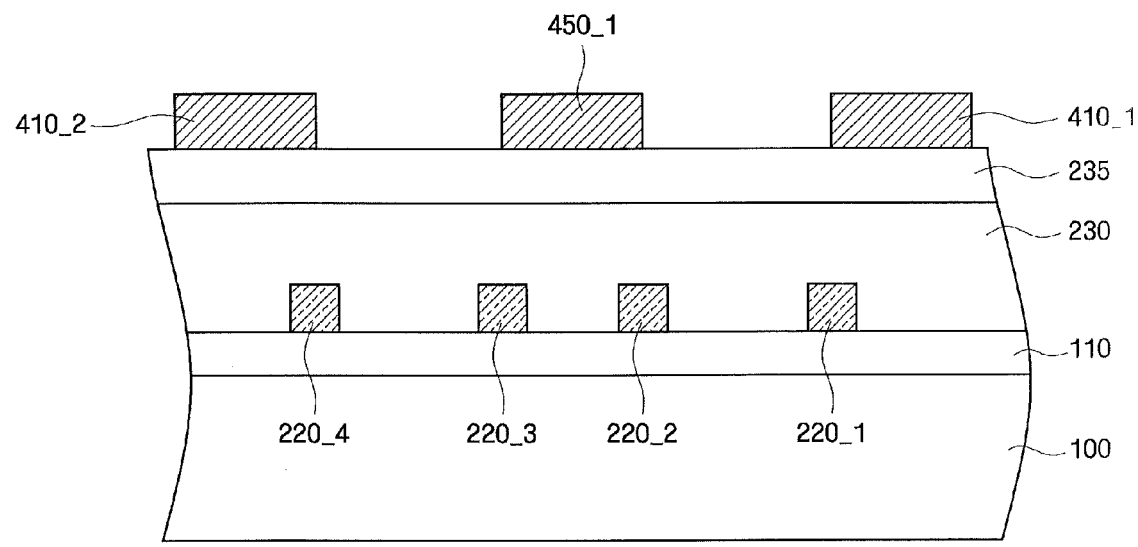
Figure 17B:
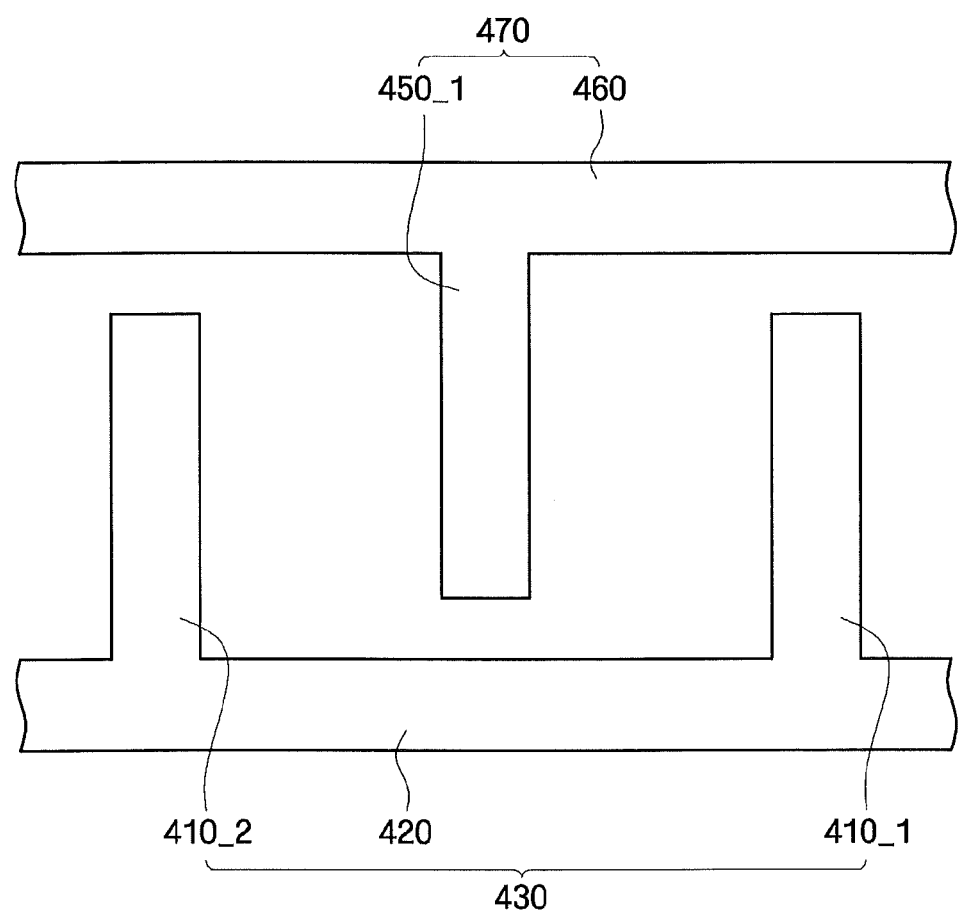

Referring to FIGS. 17A and 17B, the second interlayer insulating layer 235 is formed on the bit line 300_1.

The first metal wire 430 and the second metal wire 470 are formed on the second interlayer insulating layer 235. The first metal wire 430 includes the first conductive layer 410_1 and the third conductive layer 410_2 connected to each other, and the connection wire 430. The second metal wire 470 includes the second conductive layer 450_1 and the second connection wire 460 connected to each other.

Figure 18A:
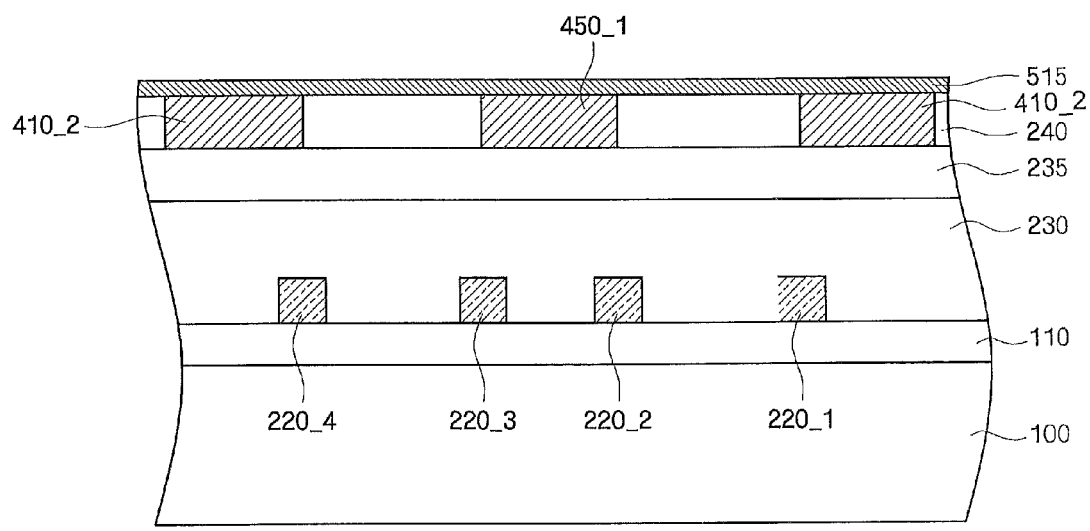
Figure 18B:
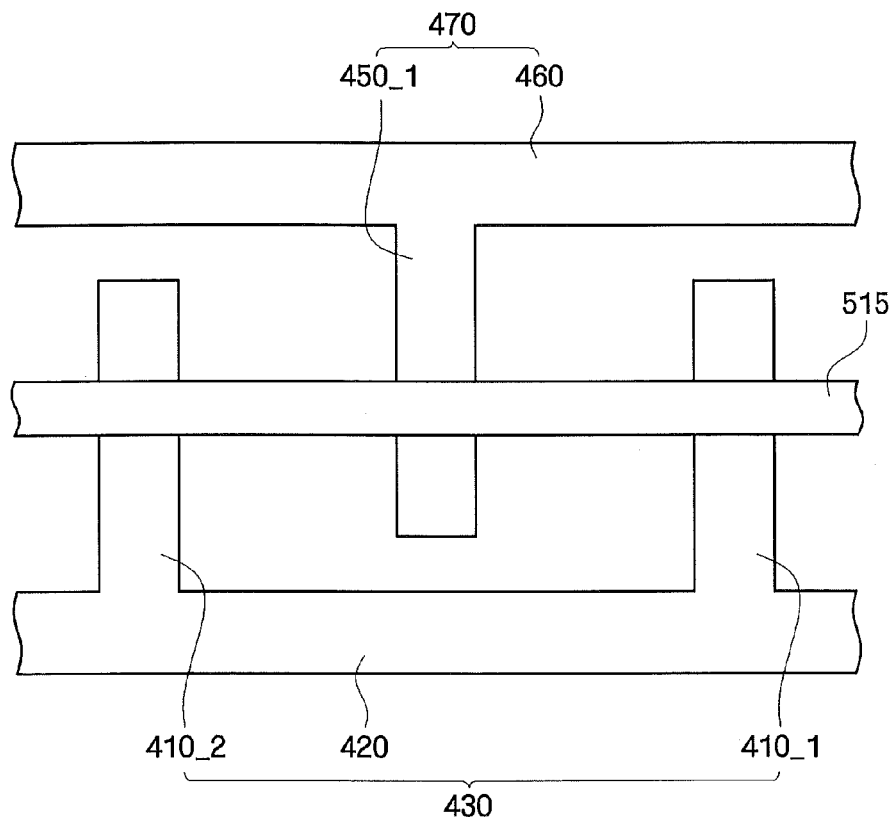

Referring to FIGS. 18A and 18B, the third interlayer insulating layer 240 is formed, the third interlayer insulating layer 240 filling space surrounding the first metal wire 430 and the second metal wire 470 and exposing top surfaces of the first metal wire 430 and the second metal wire 470.

A conductive layer 515 for an electrode is formed on the third interlayer insulating layer 240 to extend in the third direction DR3 different from the second direction DR2.

Figure 19A:
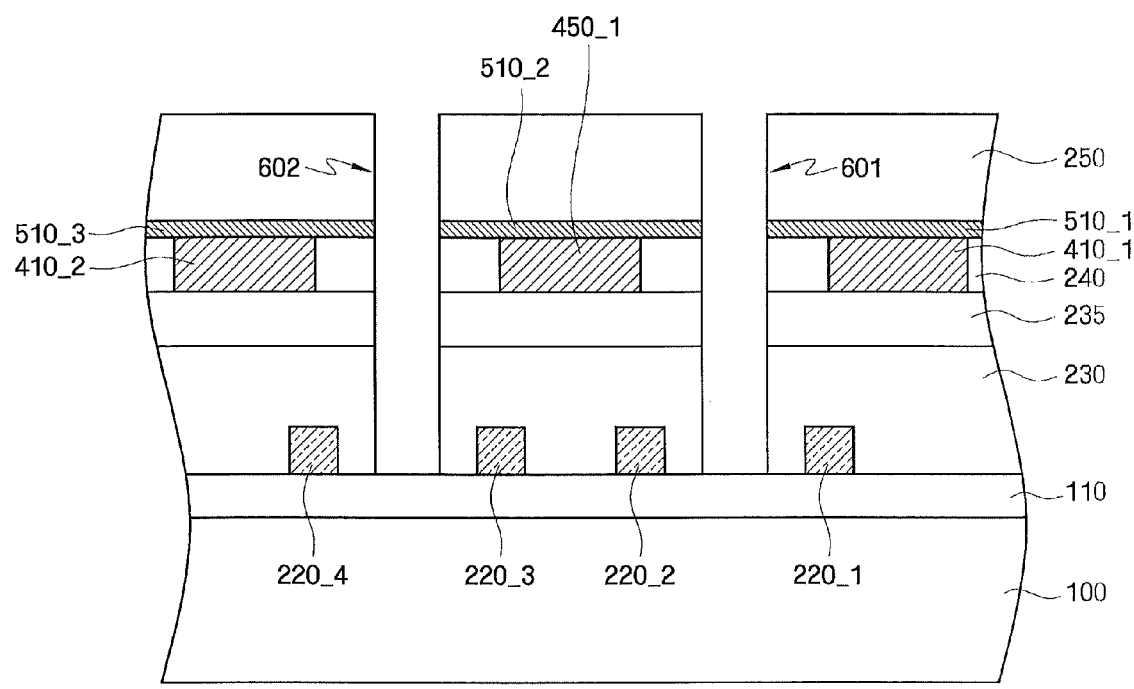
Figure 19B:
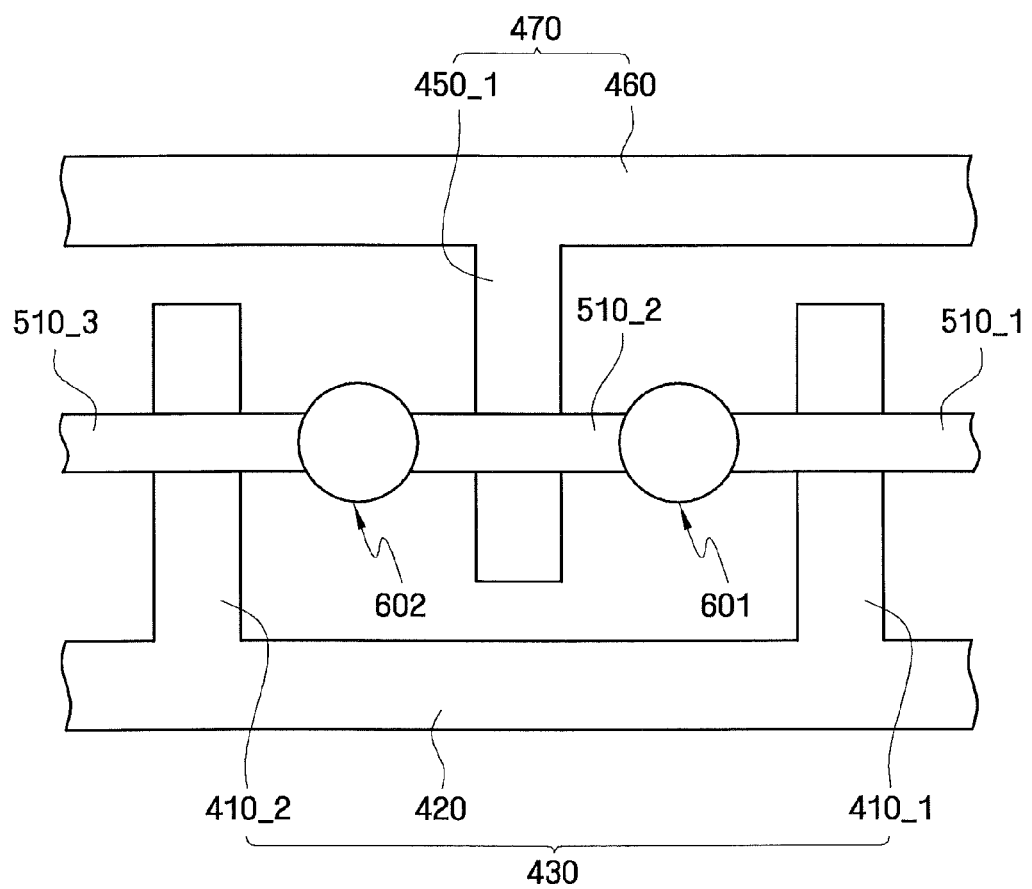

Referring to FIGS. 19A and 19B, a hole 601 is formed to extend through the conductive layer 515 for an electrode and the first through third interlayer insulating layers 230, 235, and 240 and to expose an area between the first and second gates 220_1 and 220_2, and a hole 602 is formed to expose an area between the third and fourth gates 220_3 and 220_4.

Referring back to FIGS. 5 through 7, the switching material layers 610_1 and 610_2 are formed along the sidewalls and bottom surface of the holes 601 and 602.

The variable resistors 620_1 and 620_2 are formed along the sidewalls and bottom surface of the switching material layers 610_1 and 610_2.

The bottom surfaces of the switching material layers 610_1 and 610_2 and the bottom surfaces of the variable resistors 620_1 and 620_2 are removed to expose the substrate 100.

The conductive pillars 630_1 and 630_2 are formed to contact the variable resistors 620_1 and 620_2 and the exposed substrate 100 and to fill the holes 601 and 602.

While the present inventive concept has been particularly shown and described with reference to exemplary embodiments thereof, it will be understood by those of ordinary skill in the art that various changes in form and details may be made therein without departing from the spirit and scope of the present Inventive concept as defined by the following claims. It is therefore desired that the present embodiments be considered in all respects as illustrative and not restrictive, reference being made to the appended claims rather than the foregoing description to indicate the scope of the Inventive concept.

What is claimed is:

1. A nonvolatile memory device comprising:
 a conductive pillar that extends from a substrate in a first direction;
 a variable resistor that surrounds the conductive pillar;
 a switching material layer that surrounds the variable resistor;
 a first conductive layer that extends in a second direction;
 a first electrode that extends in a third direction and contacts the first conductive layer and the switching material layer;
 a second conductive layer that extends in the second direction and being coplanar with the first conductive layer in a horizontal direction; and
 a second electrode that extends in the third direction and contacts the second conductive layer and the switching material layer;
 wherein not one of the first, second, and third directions is parallel to another one of the first, second, and third directions.

2. The nonvolatile memory device of claim 1, wherein a thickness of the first electrode is less than that of the first conductive layer.

3. The nonvolatile memory device of claim 1, wherein the first electrode is disposed on the first conductive layer.

4. The nonvolatile memory device of claim 1, further comprising:
 an active region defined in the substrate; and
 first and second gates parallel to each other disposed across the active region;
 wherein the active region is divided into first, second, and third regions by the first and second gates, the second region being located between the first and second gates; and
 wherein the conductive pillar is disposed on the second region.

5. The nonvolatile memory device of claim 4, further comprising: a bit line formed on the substrate; a first contact that electrically connects the bit line and the first region to each other; and a second contact that electrically connects the bit line and the third region to each other.

6. The nonvolatile memory device of claim 1, wherein a threshold voltage of the switching material layer is lower than that of the variable resistor.

7. The nonvolatile memory device of claim 1, wherein the switching material layer comprises AlAsTe, SiTeAsGe, AlGeAsTe and/or SiSbTe.

8. A nonvolatile memory device comprising:
- a conductive pillar that extends from a substrate in a first direction;
- a variable resistor that surrounds the conductive pillar;
- a switching material layer that surrounds the variable resistor;
- a first conductive layer that extends in a second direction; and
- a first electrode that extends in a third direction and contacts the first conductive layer and the switching material layer;
- wherein not one of the first, second, and third directions is parallel to another one of the first, second, and third directions; and
- wherein the variable resistor comprises a first program region configured to receive first electrical signals through the first electrode and store first data, and a second program region receiving configured to receive second electrical signals through the second electrode and store second data.

9. The nonvolatile memory device of claim 8, wherein the first electrical signals are received through the first conductive layer while the second conductive layer is made to float.

10. A nonvolatile memory device comprising:
- a conductive pillar that extends from a substrate in a first direction;
- a variable resistor that surrounds the conductive pillar;
- a switching material layer that surrounds the variable resistor;
- a first conductive layer that extends in a second direction;
- a first electrode that extends in a third direction and contacts the first conductive layer and the switching material layer;
- a second conductive layer that extends in the second direction and being coplanar with the first conductive layer in a vertical direction; and
- a second electrode that extends in the third direction and contacts the second conductive layer and the switching material layer;
- wherein not one of the first, second, and third directions is parallel to another one of the first, second, and third directions.

* * * * *